(12) United States Patent
Kang et al.

(10) Patent No.: US 10,109,698 B2
(45) Date of Patent: Oct. 23, 2018

(54) ORGANIC LIGHT-EMITTING DISPLAY DEVICE

(71) Applicant: Samsung Display Co., Ltd., Yongin-si, Gyeonggi-do (KR)

(72) Inventors: Kinyeng Kang, Yongin-si (KR); Sunkwang Kim, Yongin-si (KR); Heejun Yoo, Yongin-si (KR); Jonghyun Choi, Yongin-si (KR)

(73) Assignee: Samsung Display Co., Ltd. (KR)

( * ) Notice: Subject to any disclaimer, the term of this patent is extended or adjusted under 35 U.S.C. 154(b) by 67 days.

(21) Appl. No.: 14/964,108

(22) Filed: Dec. 9, 2015

(65) Prior Publication Data
US 2016/0380038 A1 Dec. 29, 2016

(30) Foreign Application Priority Data
Jun. 29, 2015 (KR) .................. 10-2015-0092028

(51) Int. Cl.
*H01L 27/32* (2006.01)
*H01L 27/12* (2006.01)

(52) U.S. Cl.
CPC ...... *H01L 27/3276* (2013.01); *H01L 27/3218* (2013.01); *H01L 27/3246* (2013.01); *H01L 27/3262* (2013.01); *H01L 27/3265* (2013.01); *H01L 27/124* (2013.01)

(58) Field of Classification Search
CPC ............. H01L 27/3276; H01L 27/3218; H01L 27/3246; H01L 27/3262; H01L 27/3265; H01L 27/124
See application file for complete search history.

(56) References Cited

U.S. PATENT DOCUMENTS

| | | |
|---|---|---|
| 2011/0241014 A1 | 10/2011 | Yoon et al. |
| 2012/0161611 A1 | 6/2012 | Ahn |
| 2012/0169683 A1* | 7/2012 | Hong .................. H01L 27/3211 345/206 |
| 2014/0034923 A1 | 2/2014 | Kim et al. |

(Continued)

FOREIGN PATENT DOCUMENTS

| | | |
|---|---|---|
| KR | 10-2011-0111104 | 10/2011 |
| KR | 10-2012-0073534 | 7/2012 |

(Continued)

*Primary Examiner* — Fernando L Toledo
*Assistant Examiner* — Neil Prasad
(74) *Attorney, Agent, or Firm* — Innovation Counsel LLP

(57) ABSTRACT

An organic light-emitting display device includes: a substrate; a pixel disposed on the substrate and including a first region that displays an image and a second region that transmits external light; a pixel circuit portion disposed in the first region and including at least one thin film transistor and at least one capacitor; a first electrode disposed in the first region and electrically connected with the pixel circuit portion; a pixel-defining layer including a first opening that exposes a portion of the first electrode and a second opening that corresponds to the second region; a second electrode facing the first electrode; an organic emission layer disposed between the first electrode and the second electrode; and a transparent wiring electrically connected with the pixel circuit portion and overlapping the second opening in a plan view.

16 Claims, 6 Drawing Sheets

(56) References Cited

U.S. PATENT DOCUMENTS

| | | | | |
|---|---|---|---|---|
| 2014/0183472 A1* | 7/2014 | Kim | ................... | H01L 27/3258 |
| | | | | 257/40 |
| 2015/0014650 A1* | 1/2015 | Lim | ................... | H01L 27/3262 |
| | | | | 257/40 |
| 2016/0111487 A1* | 4/2016 | Jeong | ................. | H01L 27/3279 |
| | | | | 257/40 |

FOREIGN PATENT DOCUMENTS

| | | |
|---|---|---|
| KR | 10-2012-0079318 | 7/2012 |
| KR | 10-2014-0018623 | 2/2014 |

* cited by examiner

ORGANIC LIGHT-EMITTING DISPLAY DEVICE

CROSS-REFERENCE TO RELATED APPLICATION

This application claims the benefit of Korean Patent Application No. 10-2015-0092028, filed on Jun. 29, 2015, in the Korean Intellectual Property Office, the disclosure of which is incorporated herein in its entirety by reference.

BACKGROUND

1. Field

One or more exemplary embodiments relate to an organic light-emitting display device, and more particularly, to a see-through organic light-emitting display device via which an external background as well as an image produced by the organic light-emitting display device may be recognized.

2. Description of the Related Art

An organic light-emitting display device includes an organic light-emitting diode (OLED) including a hole injection electrode, an electron injection electrode, and an organic emission layer disposed therebetween. The organic light-emitting display device is a self-luminous display device in which excitons generated while holes injected from the hole injection electrode and electrons injected from the electron injection electrode recombine in the organic emission layer fall down from an excited state to a ground state to emit light.

Since the organic light-emitting display device is a self-luminous display device that does not require a separate light source, the organic light-emitting display device may be driven by a low voltage and configured to be a light-weight and have a slim profile, and provides excellent characteristics such as wide viewing angles, high contrast, fast respond speeds, etc., and thus, the application of the organic light-emitting display device ranges from a personal portable apparatus such as an MP3 player or a mobile phone up to a television (TV).

In organic light-emitting display devices, a research is under progress into a see-through organic light-emitting display device that may recognize an external background as well as an image produced by the organic light-emitting display device.

SUMMARY

One or more exemplary embodiments include an organic light-emitting display device.

Additional aspects will be set forth in part in the description which follows and, in part, will be apparent from the description, or may be learned by practice of the presented embodiments.

According to one or more exemplary embodiments, an organic light-emitting display device includes: a substrate; a pixel disposed on the substrate and including a first region that displays an image and a second region that transmits external light; a pixel circuit portion disposed in the first region and including at least one thin film transistor and at least one capacitor; a first electrode disposed in the first region and electrically connected with the pixel circuit portion; a pixel-defining layer including a first opening that exposes a portion of the first electrode and a second opening that corresponds to the second region; a second electrode facing the first electrode; an organic emission layer disposed between the first electrode and the second electrode; and a transparent wiring electrically connected with the pixel circuit portion and overlapping the second opening in a plan view.

An area of the transparent wiring included in the pixel may be greater than that of the second opening. The transparent wiring may completely overlap the second opening.

The transparent wiring may include indium tin oxide (ITO).

A thickness of the transparent wiring may be from about 100 Å to about 300 Å.

The at least one thin film transistor may include an active layer and a gate electrode insulated from the active layer, and the gate electrode may include a lower layer including a transparent material and an upper layer contacting the lower layer and including an opaque conductive material.

A thickness of the upper layer may be greater than that of the lower layer.

The lower layer and the upper layer may include a same etching surface.

The lower layer of the gate electrode and the transparent wiring may be disposed in a same layer and may include a same material.

The at least one capacitor may include the gate electrode and an upper electrode facing the gate electrode.

The pixel may include a plurality of pixels including a first pixel and a second pixel adjacent to each other along a first direction, a scan line or a data line extending along a second direction that crosses the first direction may be disposed in a region between the first pixel and the second pixel, and the transparent wiring may extend along the first direction such that the transparent wiring is connected to the first pixel and the second pixel.

Each of the first pixel and the second pixel may include a first sub-pixel, a second sub-pixel, and a third sub-pixel disposed in the first region, and the first sub-pixel, the second sub-pixel, and the third sub-pixel may emit red light, green light, and blue light, respectively.

The scan line may be disposed in a layer in which the upper electrode is disposed, and may include a same material as that of the upper electrode, and may be electrically connected with the gate electrode.

The transparent wiring may overlap, in a plan view, the second opening included in each of the first pixel and the second pixel, and at least a portion of the scan line or the data line.

An insulating structure including at least one insulating layer may be disposed between the transparent wiring and the second opening.

The organic light-emitting display device may further include: a first driving voltage line for selectively applying a first driving voltage to the at least one thin film transistor, a reference voltage line for selectively applying a reference voltage to the at least one capacitor, and/or an initialization voltage line for selectively applying an initialization voltage to the first electrode, and the voltage lines are electrically connected to the pixel circuit portion.

The transparent wiring may be the reference voltage line and/or the initialization voltage line.

One or more exemplary embodiments include a see-through organic light-emitting display device that improves uniformity by compensating for a voltage drop, and improves an aperture ratio by disposing a wiring whose resistance does not need to be low in a transmission region. As understood by one of ordinary skill in the art, the scope of the inventive concept is not limited to this effect.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
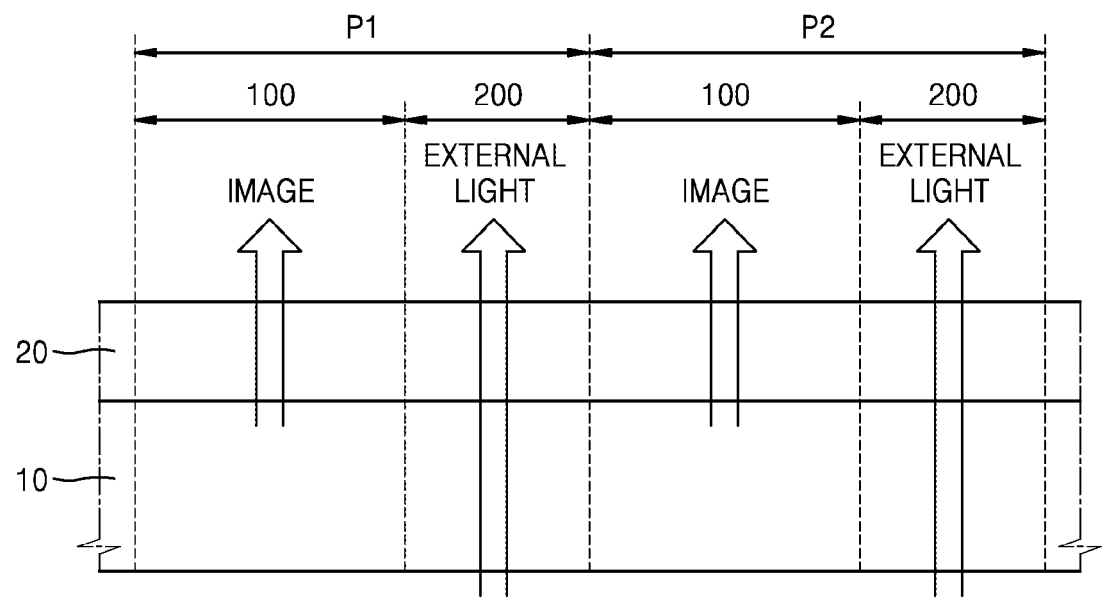
FIG. 1 is a schematic cross-sectional view illustrating an organic light-emitting display device according to an exemplary embodiment.

As the inventive concept allows for various changes and numerous embodiments, exemplary embodiments will be illustrated in the drawings and described in detail in the written description. An effect and a characteristic of the inventive concept, and a method for accomplishing these will be apparent when exemplary embodiments described below in detail are referred together with the drawings. However, the inventive concept is not limited to exemplary embodiments described below and may be implemented in various forms.

Hereinafter, exemplary embodiments are described in detail with reference to the accompanying drawings. Like reference numerals are used for like or corresponding elements when description is made with reference to the drawings, and repeated description thereof is omitted.

As used herein, the term "and/or" includes any and all combinations of one or more of the associated listed items. Expressions such as "at least one of," when preceding a list of elements, modify the entire list of elements and do not modify the individual elements of the list.

Expressions such as "at least one of," when preceding a list of elements, modify the entire list of elements and do not modify the individual elements of the list.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Hereinafter, exemplary embodiments are described in more detail with reference to the accompanying drawings.

FIG. 1 is a schematic cross-sectional view illustrating an organic light-emitting display device according to an exemplary embodiment.

Referring to FIG. 1, the organic light-emitting display device according to an exemplary embodiment includes a substrate 10, and a display portion 20 disposed on the substrate 10 and including a plurality of pixels P1 and P2 including a first region 100 that emits light and a second region 200 that transmits external light therethrough. The external light means light incident to the organic light-emitting display device from the outside of the organic light-emitting display device. External light incident on one side of the organic light-emitting display device may pass through the substrate 10 and the display portion 20 and pass through the other side facing the one side of the organic light-emitting display device and then may be recognized by a user.

That is, a user on one side of the organic light-emitting display device may view an image displayed on the organic light-emitting display device and an image behind the organic light-emitting display device at the same time. The exemplary embodiment illustrated in FIG. 1 illustrates a top emission-type organic light-emitting display device that displays an image of the display portion 20 in a direction opposite to that of the substrate 10, but exemplary embodiments of the inventive concept are not limited thereto. That is, an organic light-emitting display device according to another exemplary embodiment may be a bottom emission-type organic light-emitting display device that displays an image of the display portion 20 in the direction of the substrate 10, or a dual emission-type organic light-emitting display device that displays an image of the display portion 20 in both the direction of the substrate 10 and the opposite direction of the substrate 10.

FIG. 1 illustrates a first pixel P1 and a second pixel P2 which are two pixels adjacent to each other in the organic light-emitting display device according to an exemplary embodiment. Each of the pixels P1 and P2 includes a first region 100 and a second region 200. An image from the display portion 20 is displayed via the first region 100, and the image behind the organic light-emitting display device may be viewed through the second region 200.

That is, according to an exemplary embodiment, each of the pixels P1 and P2 includes the first region 100 that displays an image produced by the organic light-emitting display device and the second region 200 that transmits external light therethrough, so that a user may view an image displayed on the display portion 20 and an external image when using the organic light-emitting display device.

Devices including opaque metal such as a thin film transistor, a capacitor, and an organic light-emitting diode (OLED) are not disposed in the second region 200, and external light transmittance of the second region 200 may be increased by this configuration.

Figure 2:
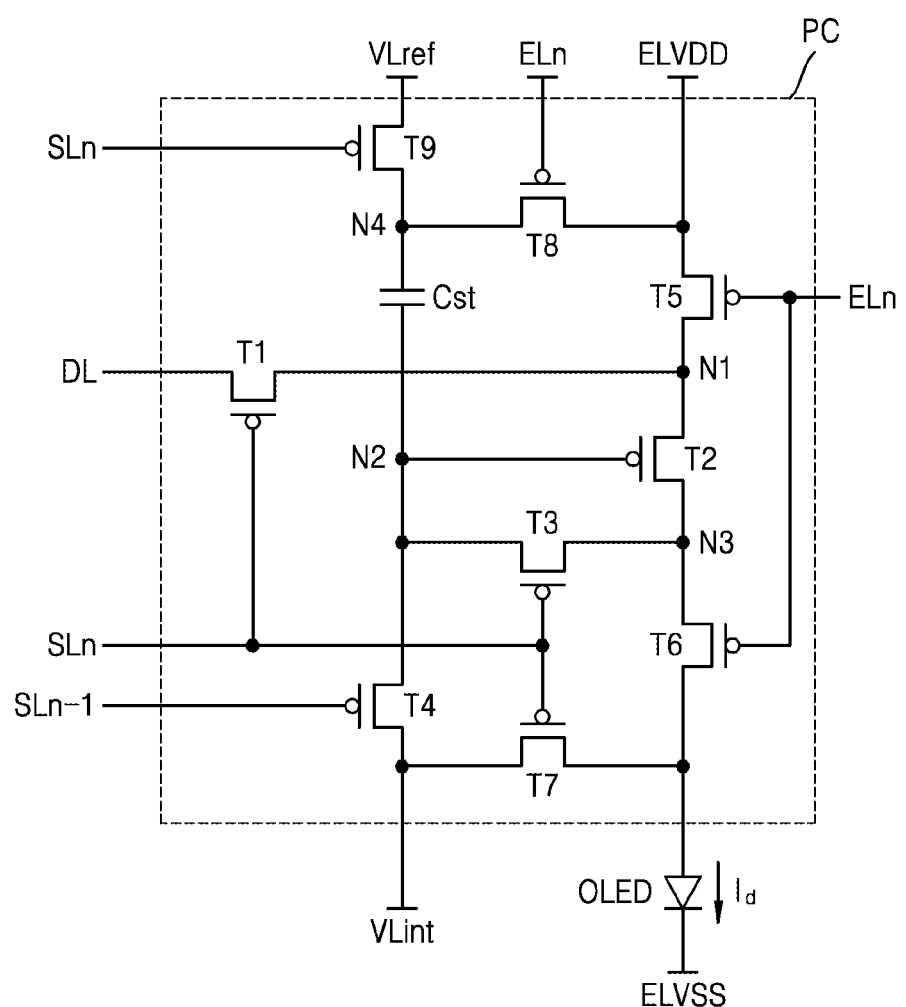
FIG. 2 is an equivalent circuit diagram of one sub-pixel of an organic light-emitting display device according to an exemplary embodiment.

FIG. 2 is an equivalent circuit diagram of one sub-pixel of an organic light-emitting display device according to an exemplary embodiment.

Referring to FIG. 2, the organic light-emitting display device includes a plurality of pixels including the first pixel P1 and the second pixel P2 of FIG. 1. Each of the first pixel P1 and the second pixel P2 may include a plurality of sub-pixels emitting light of different colors. Each of the sub-pixels includes the OLED and a pixel circuit portion PC that drives the OLED. The pixel circuit portion PC may include at least one thin film transistor (TFT) and at least one capacitor. The pixel circuit portion PC may be electrically connected with a plurality of lines that apply a voltage, a scan signal, or a data signal to at least one of the at least one TFT and the at least one capacitor. The pixel circuit portion PC according to an exemplary embodiment includes nine TFTs T1 to T9 and one capacitor Cst, but exemplary embodiments of the inventive concept are not limited thereto, and at least one of the TFTs T1 to T9 may be omitted and at least one TFT or at least one capacitor besides the capacitor Cst may be further added.

The TFT may include a switching TFT T1, a driving TFT T2, a first compensation TFT T3, a first initialization TFT T4, a first emission control TFT T5, a second emission control TFT T6, and a second initialization TFT T7, and may additionally include a second compensation TFT T8 and a third compensation TFT T9 each being connected to the capacitor Cst. The second compensation TFT T8 and the third compensation TFT T9 compensate for a voltage drop of a first driving voltage ELVDD applied by a first driving voltage line.

The switching TFT T1 includes a gate electrode connected to a scan line SLn, a source electrode connected to a data line DL, and a drain electrode connected to a first node N1. The switching TFT T1 is turned on by a scan signal of a gate-on voltage transferred via the scan line SLn, and transfers a data signal transferred via the data line DL to the first node N1.

The driving TFT T2 includes a gate electrode connected to a second node N2, a source electrode connected to the first node N1, and a drain electrode connected to a third node N3. The driving TFT T2 supplies a current according to a voltage applied to the second node N2 to the third node N3.

The first compensation TFT T3 includes a gate electrode connected to the scan line SLn, a drain electrode connected to the second node N2, and a source electrode connected to the third node N3. The first compensation TFT T3 is turned on by a scan signal of a gate-on voltage transferred via the scan line SLn, and connects the drain electrode of the driving TFT T2 with the gate electrode of the driving TFT T2. That is, the first compensation TFT T3 diode-connects the driving TFT T2.

The first initialization TFT T4 includes a gate electrode connected to a previous scan line SLn-1, a source electrode connected to an initialization voltage line VLint, and a drain electrode connected to the second node N2. The first initialization TFT T4 is turned on by a previous scan signal of a gate-on voltage transferred via the previous scan line SLn-1, and applies an initialization voltage transferred by the initialization voltage line VLint to the second node N2, that is, the gate electrode of the driving TFT T2. That is, the first initialization TFT T4 initializes a voltage of the gate electrode of the driving TFT T2

The first emission control TFT T5 includes a gate electrode connected to an emission control line ELn, a source electrode to which the first driving voltage ELVDD is applied, and a drain electrode connected to the first node N1. When the first emission control TFT T5 is turned on, the first driving voltage ELVDD is applied to the first node N1, that is, the source electrode of the driving TFT T2.

The second emission control TFT T6 includes a gate electrode connected to the emission control line ELn, a source electrode connected to the third node N3, and a drain electrode connected to a first electrode 151 (see FIG. 4) of the OLED. The first emission control TFT T5 and the second emission control TFT T6 are simultaneously turned on according to an emission control signal transferred via the emission control line ELn, and allows a driving current $I_d$ to flow from the side of the first driving voltage ELVDD to the OLED.

The second initialization TFT T7 includes a gate electrode connected to the scan line SLn, a source electrode connected to the initialization voltage line VLint, and a drain electrode connected to the first electrode 151 (see FIG. 4) of the OLED. The second initialization TFT T7 is turned on by a scan signal transferred via the scan line SLn, and initializes the first electrode 151 of the OLED. The gate electrode of the second initialization TFT T7 may be connected to a separate line, not the scan line SLn, and the second initialization TFT T7 may be omitted when needed.

The second compensation TFT T8 includes a gate electrode connected to the emission control line ELn, a source electrode to which the first driving voltage ELVDD is applied, and a drain electrode connected to a fourth node N4. The second compensation TFT T8 is turned on by an emission control signal transferred via the emission control line ELn, and allows the first driving voltage ELVDD to be applied to an upper electrode 127 (see FIG. 4) of the capacitor Cst.

The third compensation TFT T9 includes a gate electrode connected to the scan line SLn, a source electrode connected to a reference voltage line VLref, and a drain electrode connected to the fourth node N4. The third compensation TFT T9 is turned on by a scan signal transferred via the scan line SLn, and applies a reference voltage transferred via the reference voltage line VLref to the upper electrode 127 of the capacitor Cst.

Figure 4:
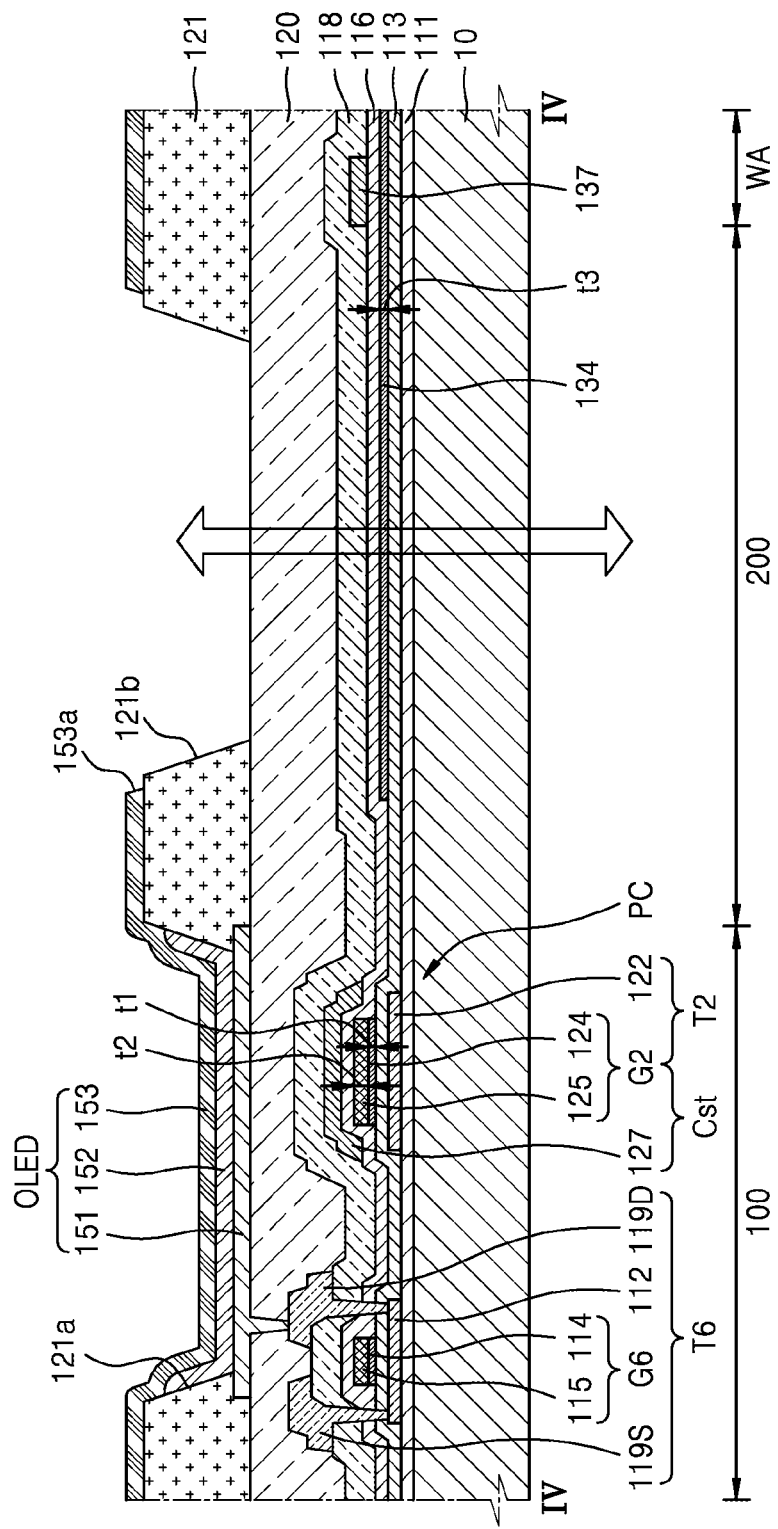
FIG. 4 is a cross-sectional view taken along a line IV-IV' of FIG. 3.

The capacitor Cst includes a lower electrode G2 (see FIG. 4) and the upper electrode 127 (see FIG. 4). The lower electrode G2 may be connected to the second node N2, and the upper electrode 127 may be connected to the fourth node N4. The capacitor Cst is charged with a voltage corresponding to a voltage difference between the second node N2 and the fourth node N4.

The first driving voltage ELVDD is connected to each of the pixels to supply a current to the pixels, and voltage drops of different magnitudes occur depending on the positions of the pixels in the display device. However, the reference voltage transferred via the reference voltage line VLref does not supply a current to the pixels and thus is set to the same voltage regardless of the positions of the pixels in the display device.

The third compensation TFT T9 is turned on only when charging the capacitor Cst. When charging the capacitor Cst, the reference voltage is applied to the fourth node N4 via the reference voltage line VLref. Therefore, the capacitor Cst is charged with a voltage corresponding to a voltage difference between the reference voltage and the second node N2. After that, when the third compensation TFT T9 is turned off and the second compensation TFT T8 is turned on, a voltage at the fourth node N4 changes to a first driving voltage ELVDD decreased by a voltage drop.

A voltage at the second node N2 changes in response to the amount of voltage change at the fourth node N4. That is, the voltage applied to the second node N2 may be a voltage obtained by subtracting a voltage drop of the first driving voltage ELVDD from a voltage of a data signal compensated by the first compensation TFT T3. Therefore, while the OLED emits light, the voltage of the second node N2 connected to the gate electrode of the driving TFT T2 changes by the amount of voltage change of the first node N1 connected with the source electrode of the driving TFT T2. That is, by the compensation mechanism, the OLED emits light at uniform brightness regardless of the positions of pixels, and thus the uniformity of the organic light-emitting display device may improve.

The OLED includes the first electrode 151 (see FIG. 4) and a second electrode 153 (see FIG. 4) to which a second voltage ELVSS is applied. According to an exemplary embodiment, the OLED may emit red light, green light, blue light, or white light.

According to an exemplary embodiment, the TFTs T1 to T9 may be p-channel field effect transistors but are not limited thereto and at least some of the TFTs T1 to T9 may be n-channel field effect transistors.

According to an exemplary embodiment, a gate electrode of the second compensation TFT T8 is connected to the emission control line ELn, and a gate electrode of the third compensation TFT T9 is connected to the scan line SLn, but exemplary embodiments of the inventive concept are not limited thereto. That is, according to another exemplary embodiment, the second compensation TFT T8 and the third compensation TFT T9 may be connected to separate lines and turned on/off depending on a gate-on voltage or a gate-off voltage of the separate lines.

Figure 3:
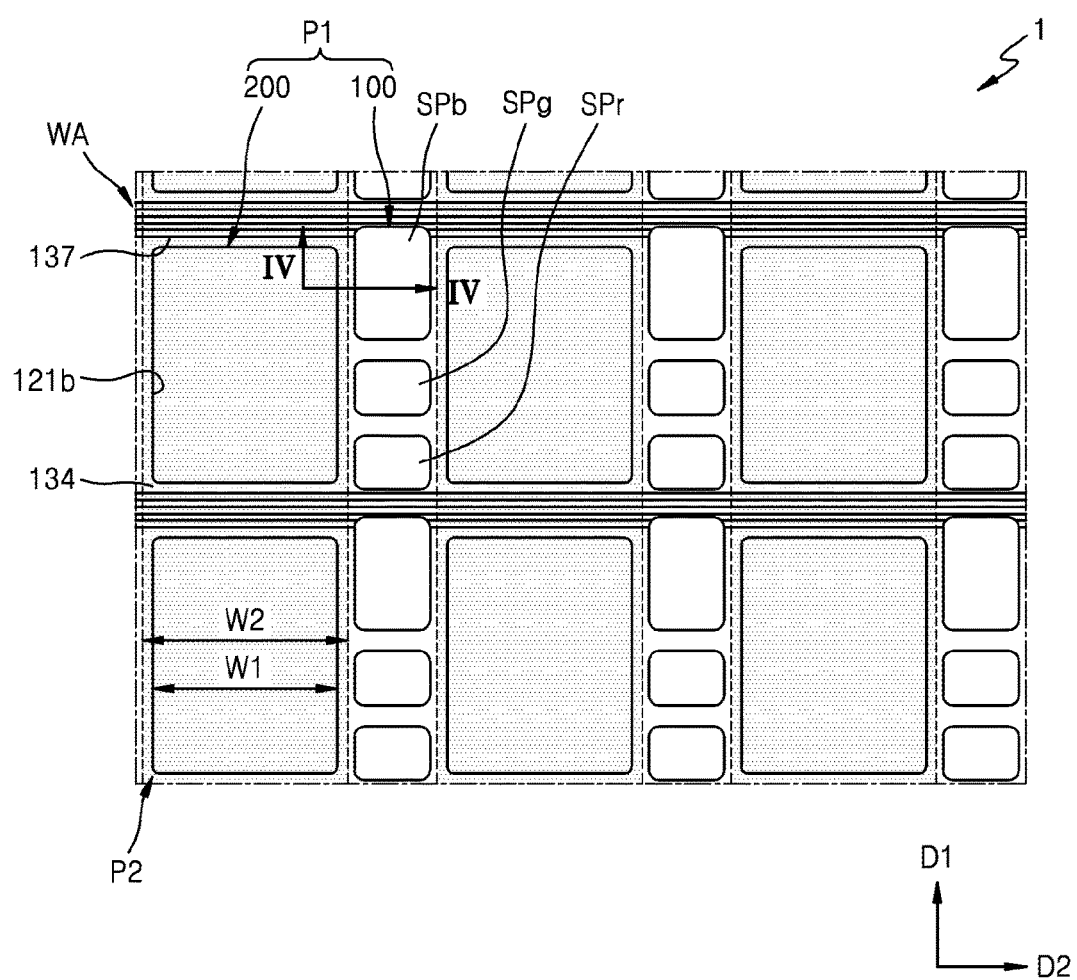
FIG. 3 is a schematic plan view illustrating a plurality of pixels included in an organic light-emitting display device according to an exemplary embodiment.

FIG. 3 is a schematic plan view illustrating a plurality of pixels included in an organic light-emitting display device 1 according to an exemplary embodiment, and FIG. 4 is a cross-sectional view taken along a line IV-IV' of FIG. 3.

Referring to FIGS. 3 and 4, the organic light-emitting display device 1 according to an exemplary embodiment includes a substrate 10, a pixel P1 disposed on the substrate 10 and including a first region 100 that displays an image and a second region 200 that transmits external light, a pixel circuit portion PC including at least one thin film transistor T2 and at least one capacitor Cst, the first electrode 151 disposed in the first region 100 and electrically connected with the pixel circuit portion PC, a pixel-defining layer 121 including a first opening 121a that exposes a portion of the first electrode 151 and a second opening 121b corresponding to the second region 200, the second electrode 153 facing the first electrode 151, an organic emission layer 152 disposed between the first electrode 151 and the second electrode 153, and a transparent wiring 134 electrically connected with the pixel circuit portion PC and overlapping the second opening 121b in a plan view.

The one pixel P1 included in the organic light-emitting display device 1 includes the first region 100 that emits light of a predetermined color and the second region 200 that transmits external light, and a user may view an image behind the organic light-emitting display device 1 via the second region 200. That is, the organic light-emitting display device 1 may be a transparent display.

The first region 100 may include a first sub-pixel SPr, a second sub-pixel SPg, and a third sub-pixel SPb that respectively emit light of different colors. The first sub-pixel SPr, the second sub-pixel SPg, and the third sub-pixel SPb may emit red light, green light, and blue light, respectively. However, exemplary embodiments of the inventive concept are not limited thereto and any combination of colors may be emitted as long as white light may be produced by the combination.

Each of the first sub-pixel SPr, the second sub-pixel SPg, and the third sub-pixel SPb may be driven by the pixel circuit portion PC. According to an exemplary embodiment, the pixel circuit portion PC may overlap the first electrode 151, in a plan view, included in each of the first sub-pixel SPr, the second sub-pixel SPg, and the third sub-pixel SPb. This configuration is suitable for an organic light-emitting display device where the first electrode 151 is a reflective electrode and the second electrode 153 is a transparent or semi-transparent electrode, that is, a top-emission type organic light-emitting display device 1. Since the pixel circuit portion PC is disposed between the substrate 10 and the first electrode 151 to overlap the first electrode 151, a separate space for disposing the pixel circuit portion PC is not required, and thus an aperture ratio may increase.

However, exemplary embodiments of the inventive concept are not limited thereto and an organic light-emitting display device according to another exemplary embodiment may be a bottom emission-type organic light-emitting display device where a first electrode is a transparent or semi-transparent electrode and a second electrode is a reflective electrode. In this case, the pixel circuit portion PC may not overlap the first electrode so as not to hinder a path of emitted light.

The organic light-emitting display device 1 according to an exemplary embodiment includes a plurality of pixels, and hereinafter, two pixels adjacent to each other among the plurality of pixels are referred to as the first pixel P1 and the second pixel P2, for convenience in description.

The first pixel P1 and the second pixel P2 may be disposed adjacent to each other along a first direction D1, and a scan line or a data line extending along a second direction D2 that crosses the first direction D1 may be disposed in a region between the first pixel P1 and the second pixel P2. According to an exemplary embodiment, a line extending along the second direction D2 may be the scan line but is not limited thereto.

The second region 200 is a transparent region in which light incident on one side of the substrate 10 from the outside of the organic light-emitting display device 1 passes through the organic light-emitting display device 1 and is recognized by a user. Opaque materials such as a reflective electrode, an opaque wiring, etc. may not be disposed in the second region 200.

The transparent wiring 134 having high transmittance and electrically connected with the pixel circuit portion PC may be disposed in the second region 200 of the organic light-emitting display device 1 according to an exemplary embodiment, and may extend along the first direction D1 such that the transparent wiring 134 is connected with the first pixel P1 and the second pixel P2. That is, the transparent wiring 134 may extend along the first direction D1 such that the transparent wiring 134 is connected to all of the plurality of pixels disposed along the first direction D1.

The transparent wiring 134 may be the reference voltage line VLref and/or the initialization voltage line VLint of FIG. 2 but is not limited thereto. Since the reference voltage and the initialization voltage respectively transferred via the reference voltage line VLref and the initialization voltage line VLint do not supply a current to pixels, a voltage drop does not occur.

Therefore, the reference voltage line VLref and/or the initialization voltage line VLint may include the transparent wiring 134 including a transparent conductive oxide having relatively large resistance. Since the transparent wiring 134 is transparent, the transparent wiring 134 may be disposed in the second region 200 that occupies an about 40% or more of an area of the organic light-emitting display device. Therefore, an area in which the pixel circuit portion PC and opaque wirings are disposed may be reduced, so that high resolution may be implemented.

According to an exemplary embodiment, all transparent wirings 134 may be reference voltage lines VLref. According to another exemplary embodiment, all transparent wirings 134 may be initialization voltage lines VLint. According to still another exemplary embodiment, the transparent wirings 134 may be reference voltage lines VLref and initialization voltage lines VLint. The reference voltage lines VLref and the initialization voltage lines VLint may be disposed in turns along the second direction D2 in the second region 200 of the organic light-emitting display device 1.

Hereinafter, the structure of one cross-section of the organic light-emitting display device 1 is described according to a manufacturing sequence with reference to FIG. 4.

The substrate 10 may include glass or plastic, etc., and a buffer layer 111 may be disposed on the substrate 10. The buffer layer 111 blocks penetration of impurity elements through the substrate 10, and planarizes the surface of the substrate 10, and may include a layer or layers including an inorganic material such as SiNx and/or SiO$_2$.

The pixel circuit portion PC may be disposed in the first region 100 on the buffer layer 111 and may include a TFT T2. According to an exemplary embodiment, the TFT T2 may be a driving TFT T2. The driving TFT T2 may include an active layer 122 and a gate electrode G2 disposed on the buffer layer 111. A first insulating layer 113 may be disposed between the active layer 122 and the gate electrode G2. The first insulating layer 113 may be a gate insulating layer and may cover the first region 100 and the second region 200.

The driving TFT T2 is illustrated as a top gate-type TFT in which the gate electrode G2 is disposed above the active layer 122. However, the driving TFT T2 is not limited thereto, and the gate electrode G2 may be disposed below the active layer 122.

The active layer 122 may include various materials. According to an exemplary embodiment, the active layer 122 may include an inorganic semiconductor material such as amorphous silicon or crystalline silicon. According to another exemplary embodiment, the active layer 122 may include an oxide semiconductor or an organic semiconductor material.

The gate electrode G2 may include a lower layer 124 including a transparent material and an upper layer 125 disposed on the lower layer 124 and including an opaque conductive material. The upper layer 125 may include a single layer or layers and have conductivity higher than that of the transparent material forming the lower layer 124.

The upper layer 125 may include a single layer or layers including at least one of Al, Pt, Pd, Ag, Mg, Au, Ni, Nd, Ir, Cr, Li, Ca, Mo, Ti, W, and Cu.

According to an exemplary embodiment, the transparent material forming the lower layer 124 may be a transparent conductive oxide such as indium tin oxide (ITO), and the opaque conductive material may be Mo. According to an exemplary embodiment, a thickness t1 of the lower layer 124 may be from about 100 Å to about 300 Å, and a thickness t2 of the upper layer 125 may be about 3000 Å. The lower layer 124 and the upper layer 125 may be patterned using one mask process, and may include the same etching surface. The lower layer 124, the transparent wiring 134, and the upper layer 125 may be patterned using the same mask process that uses a half-tone mask.

The transparent wiring 134 may be disposed in the second region 200 on the buffer layer 111. The transparent wiring 134 may be a transparent conductive oxide such as ITO, and may be thin so as not to reduce the transmittance of the second region 200. A thickness t3 of the transparent wiring 134 may be from about 100 Å to about 300 Å.

The lower layer 124 and the transparent wiring 134 may be disposed in the same layer, and may include the same material. That is, the lower layer 124 and the transparent wiring 134 may be formed by using the same process, and the thickness t1 of the lower layer 124 and the thickness t3 of the transparent wiring 134 may be the same. A second insulating layer 116 that covers the gate electrode G2 and the transparent wiring 134 may be disposed on the first insulating layer 113. The second insulating layer 116 may include a single layer or layers including an inorganic material such as SiNx and/or SiO$_2$.

The upper electrode 127 of the capacitor Cst may be disposed in the first region 100 on the second insulating layer 116, and a scan line 137 may be disposed in the wiring region WA on the second insulating layer 116. The upper electrode 127 and the scan line 137 may include an opaque conductive material.

The upper electrode 127 and the scan line 137 may include a single layer or layers including at least one of Al, Pt, Pd, Ag, Mg, Au, Ni, Nd, Ir, Cr, Li, Ca, Mo, Ti, W, and Cu. According to an exemplary embodiment, the upper electrode 127 and the scan line 137 may include a single layer including Mo.

The upper electrode 127 may form the capacitor Cst together with the gate electrode G2. That is, the gate electrode G2 may serve as the gate electrode G2 of the driving TFT T2 and the lower electrode of the capacitor Cst, simultaneously. That is, the area of the pixel circuit portion PC may be minimized while maintaining a high capacity capacitor Cst by forming the driving TFT T2 and the capacitor Cst that occupy a wide region in the pixel circuit portion PC to overlap each other in a plan view in order to secure a channel length. This configuration may be advantageous in implementing the organic light-emitting display device 1 of high resolution.

The second insulating layer 116 may cover not only the first region 100 but also the second region 200 and a wiring area WA. The scan line 137 may be disposed in the wiring area WA on the second insulating layer 116. The scan line 137 may be disposed in the layer in which the upper layer 127 of the capacitor Cst is formed and may include the same material as that of the upper layer 127. That is, the scan line 137 and the upper electrode 127 may be formed via the same process. The scan line 137 transfers a scan signal to the gate electrode G2, and though not shown, the scan line 137 may be electrically connected with the gate electrode G2.

A portion of the scan line 137 may overlap a portion of the transparent line 134 in a plan view. As illustrated in FIG. 3, the scan line 137 may be disposed between the first pixel P1 and the second pixel P2 disposed along the first direction D1, and thus may overlap, in a plan view, the transparent wiring 134 that extends along the first direction D1 such that the transparent wiring 134 is connected to the first pixel P1 and the second pixel P2. That is, the transparent wiring 134 may be disposed below the scan line 137.

According to an exemplary embodiment, the scan line 137 may overlap a portion of the transparent wiring 134 in a plan view, but according to another exemplary embodiment, the scan line 137 may be replaced by a wiring that performs a different function such as the emission control line ELn (see FIG. 2). According to still another exemplary embodiment, both the scan line 137 and the emission control line ELn may overlap a portion of the transparent wiring 134 in a plan view.

A third insulating layer 118 and a fourth insulating layer 120 that cover the upper electrode 127 and the scan line 137 may be disposed on the second insulating layer 116. The OLED including the first electrode 151, the second electrode 153 facing the first electrode 151, and the organic emission layer 152 disposed between the first electrode 151 and the second electrode 153 may be disposed in the first region 100 on the fourth insulating layer 120.

The third insulating layer 118 may include a single layer or layers including an inorganic material such as SiNx and/or $SiO_2$, and the fourth insulating layer 120 may include an organic material in order to planarize the pixel circuit portion PC.

The pixel-defining layer 121 may cover edges of the first electrode 151. The pixel-defining layer 121 may include the first opening 121a that exposes a portion of the first electrode 151, and the second opening 121b corresponding to the second region 200. According to an exemplary embodiment, the pixel-defining layer 121 may include an organic material such as polyimide (PI).

The first electrode 151 may include a reflective electrode and include a reflective layer including Ag, Mg, Al, Pt, Pd, Au, Ni, Nd, Ir, Cr, and a combination thereof, and a transparent or semi-transparent electrode layer formed on the reflective layer. The first electrode 151 may be an island pattern disposed in every sub-pixel.

The second electrode 153 may include a transparent or semi-transparent electrode and include at least one of Ag, Al, Mg, Li, Ca, Cu, LiF/Al, MgAg, and CaAg, and may be formed in a thin film shape having a thickness of several nm to tens of nm. The second electrode 153 may be provided such that the second electrode 153 is electrically connected to all pixels included in the organic light-emitting display device 1.

The organic emission layer 152 may be disposed between the first electrode 151 and the second electrode 153. Though not shown, besides the organic emission layer 152, at least one of a hole injection layer (HIL), a hole transport layer (HTL), an electron transport layer (ETL), and an electron injection layer (EIL) may be further disposed between the first electrode 151 and the second electrode 153.

The organic emission layer 152 may emit red light, green light, or blue light. However, exemplary embodiments of the inventive concept are not limited thereto and a combination of various colors besides a combination of red, green, and blue may be emitted as long as white light may be implemented by the combination.

The organic light-emitting display device 1 according to an exemplary embodiment may be a top emission-type organic light-emitting display device that displays an image in a direction of the second electrode 153. The pixel circuit portion PC including the driving TFT T2 may be disposed between the substrate 10 and the first electrode 151 to overlap the first electrode 151.

According to an exemplary embodiment, the second electrode 153 may include an opening 153a formed in the second region 200. Transmittance of the organic light-emitting display device 1 may improve through this configuration. However, exemplary embodiments of the inventive concept are not limited thereto, and according to another exemplary embodiment, the second electrode 153 including a transparent or semi-transparent material may be formed not only in the first region 100 but also on the entire surface of the second region 200.

The second opening 121b of the pixel-defining layer 121 may be formed in the second region 200, and the transparent wiring 134 may overlap the second opening 121b in a plan view. The transparent wiring 134 may be disposed in a portion of the second region 200 and the wiring area WA, and a width W2 of the transparent wiring 134 in the second direction D2 may be greater than a width W1 of the second opening 121b in the second direction D2.

The area of the transparent wiring 134 may be greater than the area of the second opening 121b. Here, the area of the transparent wiring 134 represents the area of a region of the transparent wiring 134 that corresponds to one pixel, not the area of the entire transparent wiring 134. A boundary between a region in which the transparent wiring 134 is disposed and a region in which the transparent wiring 134 is not disposed may be at the outer portion of the second opening 121b. That is, the boundary may not be on a path of light that passes through the second opening 121b, and thus a user may not easily recognize the transparent wiring 134.

An insulating structure including the second insulating layer 116, the third insulating layer 118, and the fourth insulating layer 120 may be disposed between the transparent wiring 134 and the second opening 121b. That is, the insulating structure covers the transparent wiring 134, and the second opening 121b may not expose the transparent wiring 134. However, in alternative embodiment, the fourth insulating layer 120 on the transparent wiring 134 may be removed to further improve the transmittance of the second region 200."

The transparent wiring 134 may be the reference voltage line VLref that selectively applies the reference voltage to the upper electrode 127 of the capacitor Cst and/or the initialization voltage line VLint that selectively applies the initialization voltage to the first electrode 151.

The pixel circuit portion PC disposed in the first region 100 may further include the second emission control TFT T6 illustrated in FIG. 2 in addition to the driving TFT T2. The second emission control TFT T6 may include an active layer 112, a gate electrode G6 including a lower layer 114 and an upper layer 115, a source electrode 119S and a drain electrode 119D, each of which is electrically connected with the active layer 112. The drain electrode 119D may be electrically connected with the first electrode 151 of the OLED. The first insulating layer 113 may be disposed between the active layer 112 and the gate electrode G6. The second insulating layer 116 and the third insulating layer 118 may be sequentially disposed between the gate electrode G6 and the source and drain electrodes 119S and 119D. The fourth insulating layer 120 may cover the source electrode 119S and the drain electrode 119D.

As described above, according to an exemplary embodiment, the see-through organic light-emitting display device 1 that has improved uniformity by compensating for a voltage drop may be implemented.

Also, the transparent wiring 134 is disposed in the second region 200 of the organic light-emitting display device 1, so that a separate space for disposing lines such as the initialization voltage line VLint and/or the reference voltage line VLref, which do not require a low resistance conductive layer, is not required, and thus the aperture ratio of the organic light-emitting display device 1 may improve.

Figure 5:
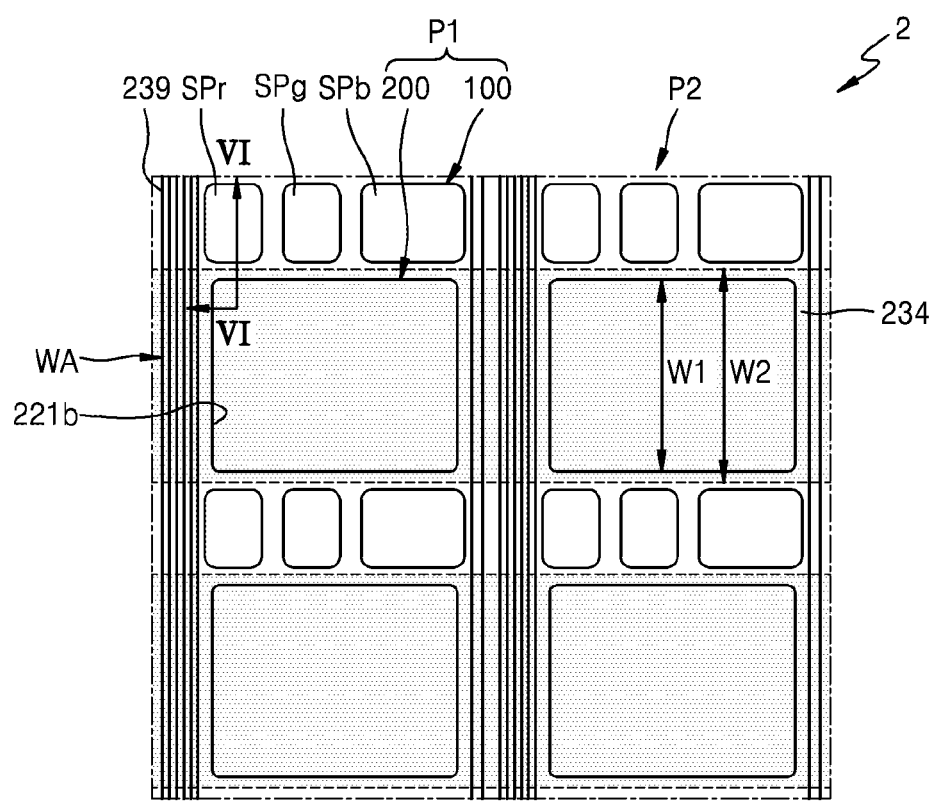
FIG. 5 is a schematic plan view illustrating a plurality of pixels included in an organic light-emitting display device according to another exemplary embodiment.
Figure 6:
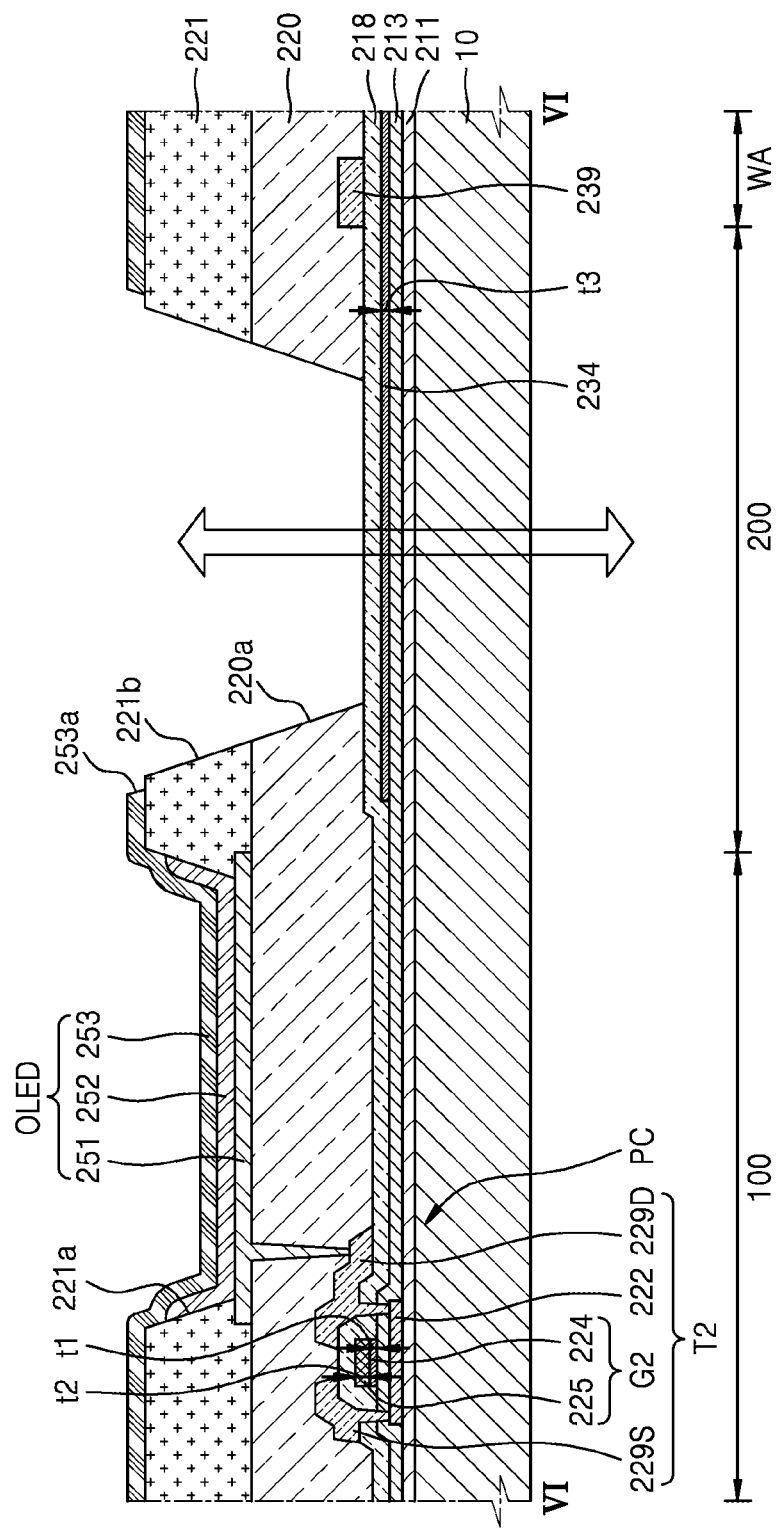
FIG. 6 is a cross-sectional view taken along a line VI-VI' of FIG. 5.

FIG. 5 is a schematic plan view illustrating a plurality of pixels included in an organic light-emitting display device 2 according to another exemplary embodiment, and FIG. 6 is a cross-sectional view taken along a line VI-VI' of FIG. 5.

Referring to FIGS. 5 and 6, the organic light-emitting display device 2 according to an exemplary embodiment includes a substrate 10, a pixel P1 disposed on the substrate 10 and including a first region 100 that produces an image and a second region 200 that transmits external light, a pixel circuit portion PC including at least one thin film transistor T2 and at least one capacitor Cst, a first electrode 251 disposed in the first region 100 and electrically connected with the pixel circuit portion PC, a pixel-defining layer 221 including a first opening 221a that exposes a portion of the first electrode 251 and a second opening 221b corresponding to the second region 200, a second electrode 253 facing the first electrode 251, an organic emission layer 252 disposed between the first electrode 251 and the second electrode 253, and a transparent wiring 234 electrically connected with the pixel circuit portion PC and overlapping the second opening 221b in a plan view.

The first region 100 may include a first sub-pixel SPr, a second sub-pixel SPg, and a third sub-pixel SPb that respectively emit light of different colors. The first sub-pixel SPr, the second sub-pixel SPg, and the third sub-pixel SPb may emit red light, green light, and blue light, respectively.

Each of the first sub-pixel SPr, the second sub-pixel SPg, and the third sub-pixel SPb may be driven by the pixel circuit portion PC. According to an exemplary embodiment, the pixel circuit portion PC may not overlap the first electrode 251, in a plan view, included in each of the first sub-pixel SPr, the second sub-pixel SPg, and the third sub-pixel SPb. This configuration is suitable for an organic light-emitting display device where the first electrode 251 is a transparent or semi-transparent electrode, and the second electrode 253 is a reflective electrode, that is, the bottom emission-type organic light-emitting display device 2. The pixel circuit portion PC including opaque metal, etc. may not be disposed on a light path via which light is emitted from the organic emission layer 252.

The first pixel P1 and the second pixel P2 may be disposed adjacent to each other along a first direction D1, and a scan line or a data line extending along a second direction D2 that crosses the first direction D1 may be disposed in a region between the first pixel P1 and the second pixel P2. According to an exemplary embodiment, a line extending along the second direction D2 may be the data line, and the scan line may extend to pass through the first region 100 along the first direction D1.

The second region 200 is a transparent region in which light incident on one side of the substrate 10 from the outside of the organic light-emitting display device 2 passes through the organic light-emitting display device 2 and is recognized by a user. A reflective electrode, an opaque wiring, etc. may not be disposed in the second region 200.

The transparent wiring 234 having high transmittance and electrically connected with the pixel circuit portion PC may be disposed in the second region 200 of the organic light-emitting display device 2 according to an exemplary embodiment, and may extend along the first direction D1 such that the transparent wiring 234 is connected with the first pixel P1 and the second pixel P2. That is, the transparent wiring 234 may extend along the first direction D1 such that the transparent wiring 234 is connected to all of the plurality of pixels disposed along the first direction D1.

The transparent wiring 234 may be a wiring which is connected with the pixel circuit portion PC and whose resistance does not need to be low, for example, may be the reference voltage line VLref and/or the initialization voltage line VLint of FIG. 2 but is not limited thereto. That is, a kind of the transparent wiring 234 is not specially limited but may not be a first driving voltage line, the scan line, and the data line.

Hereinafter, the structure of one cross-section of the organic light-emitting display device 2 is described according to a manufacturing sequence with reference to FIG. 6.

The substrate 10 may include glass or plastic, etc., and a buffer layer 211 may be disposed on the substrate 10. The pixel circuit portion PC may be disposed in the first region 100 on the buffer layer 211, and the pixel circuit portion PC may include a TFT T2. According to an exemplary embodiment, the TFT T2 may be a driving TFT T2. The driving TFT T2 may include an active layer 222 and a gate electrode G2 disposed on the buffer layer 211. A first insulating layer 213 may be disposed between the active layer 222 and the gate electrode G2. The first insulating layer 213 may be a gate insulating layer and may cover the first region 100 to the second region 200.

The driving TFT T2 is illustrated as a top gate-type TFT, in which the gate electrode G2 is disposed above the active layer 222, but is not limited thereto and the gate electrode G2 may be disposed below the active layer 222.

The gate electrode G2 may include a lower layer 224 including a transparent material and an upper layer 225 disposed on the lower layer 224 to contact the lower layer 224 and including an opaque conductive material. The upper layer 225 may include a single layer or layers and have conductivity higher than that of the transparent material forming the lower layer 224.

The upper layer 225 may include a single layer or layers including at least one of Al, Pt, Pd, Ag, Mg, Au, Ni, Nd, Ir, Cr, Li, Ca, Mo, Ti, W, and Cu.

According to an exemplary embodiment, the transparent material forming the lower layer 224 may be a transparent conductive oxide such as ITO, and the opaque conductive material may be a single layer including Mo. The lower layer 224 may be thin compared with that of the upper layer 225. According to an exemplary embodiment, a thickness t1 of the lower layer 224 may be from about 100 Å to about 300 Å, and a thickness t2 of the upper layer 225 may be about 3000 Å. The lower layer 224 and the upper layer 225 may be patterned using one mask process, and may include the same etching surface. The lower layer 224, the transparent wiring 234, and the upper layer 226 may be patterned using the same mask process that uses a half-tone mask.

The transparent wiring 234 may be disposed in the second region 200 on the buffer layer 211. The transparent wiring 234 may be a transparent conductive oxide such as ITO, and may be thin so as not to reduce the transmittance of the second region 200. A thickness t3 of the transparent wiring 234 may be from about 100 Å to about 300 Å. The lower layer 224 and the transparent wiring 234 may be disposed in the same layer and may include the same material. That is, the lower layer 224 and the transparent wiring 234 may be formed by using the same process, and the thickness t1 of the lower layer 224 and the thickness t3 of the transparent wiring 234 may be the same.

A third insulating layer 218 that covers the gate electrode G2 and the transparent wiring 234 may be disposed on the first insulating layer 213. The third insulating layer 218 may include a single layer or layers including an inorganic material such as SiNx and/or SiO$_2$. A source electrode 229S and a drain electrode 229D connected with the active layer 222 may be disposed in the first region 100 on the third insulating layer 218.

The source electrode 229S and the drain electrode 229D may include a single layer or layers including at least one of Al, Pt, Pd, Ag, Mg, Au, Ni, Nd, Ir, Cr, Li, Ca, Mo, Ti, W, and Cu. According to an exemplary embodiment, the source electrode 229S and the drain electrode 229D may include three layers of Mo/A/Mo or Ti/Al/Ti.

A data line 239 may be disposed in a wiring area WA on the third insulating layer 218. The data line 239 may be disposed in the layer in which the source electrode 229S and the drain electrode 229D are formed, and may include the same material as those of the source electrode 229S and the drain electrode 229D. The data line 239 may apply a data signal to the source electrode 229S.

A portion of the data line 239 may overlap a portion of the transparent wiring 234 in a plan view. The data line 239 may be disposed between the first pixel P1 and the second pixel P2 disposed along the first direction D1 as illustrated in FIG. 5, and thus overlaps, in a plan view, the transparent wiring 234 extending along the first direction D1 such that the transparent wiring 234 is connected to the first pixel P1 and the second pixel P2. That is, the transparent wiring 234 may be disposed on the lower layer of the data line 239.

According to an exemplary embodiment, the data line 239 overlaps a portion of the transparent wiring 234 in a plan view, but according to another exemplary embodiment, the data line 239 may be replaced by a first driving voltage line that applies a first driving voltage ELVDD (see FIG. 2). According to still another exemplary embodiment, both the data line 239 and the first driving voltage line may overlap a portion of the transparent wiring 234 in a plan view.

A fourth insulating layer 220 that covers the source electrode 229S, the drain electrode 229D, and the data line 239 may be disposed on the third insulating layer 218. An OLED including a first electrode 251, a second electrode 253 facing the first electrode 251, and an organic emission layer 252 disposed between the first electrode 251 and the second electrode 253 may be disposed in the first region 100 on the fourth insulating layer 220. The fourth insulating layer 220 may include an organic material in order to planarize the pixel circuit portion PC, and include an opening 220a disposed in the second region 200.

The pixel-defining layer 221 may cover edges of the first electrode 251. The pixel-defining layer 221 may include the first opening 221a that exposes a portion of the first electrode 251, and the second opening 221b corresponding to the second region 200. According to an exemplary embodiment, the pixel-defining layer 221 may include an organic material such as polyimide PI.

The first electrode 251 may include a transparent conductive layer and a transflective layer. The transparent conductive layer may include at least one of ITO, indium zinc oxide (IZO), zinc oxide (ZnO), indium oxide ($In_2O_3$), indium gallium oxide (IGO), and aluminum zinc oxide (AZO). The transflective layer may include at least one of Ag, Mg, Al, Pt, Pd, Au, Ni, Nd, Ir, Cr, Li, Ca, and Yb including a thin film of several nm to tens of nm.

The second electrode 253 may include a reflective electrode and include at least one of Ag, Al, Mg, Li, Ca, Cu, LiF/Ca, LiF/Al, MgAg, and CaAg. The second electrode 253 may include an opening 253a disposed in the second region 200.

The fourth insulating layer 220, the pixel-defining layer 221, and the second electrode 253 may include the openings 220a, 221b, 253a, respectively, disposed in the second region 200, and thus increase transmittance of the second region.

The organic emission layer 252 may be disposed between the first electrode 251 and the second electrode 253. Though not shown, besides the organic emission layer 252, at least one of a hole injection layer (HIL), a hole transport layer (HTL), an electron transport layer (ETL), and an electron injection layer (EIL) may be further disposed between the first electrode 251 and the second electrode 253.

The opening 220a of the fourth insulating layer 220 and the second opening 221b of the pixel-defining layer 221 may be formed in the second region 200, and the transparent wiring 234 may overlap the opening 220a of the fourth insulating layer 220 and the second opening 221b of the pixel-defining layer 221 in a plan view. The transparent wiring 234 may be disposed in the second region 200 and a portion of the wiring area WA. A width W2 of the transparent wiring 234 in the second direction D2 may be greater than a width W1 of the second opening 221b in the second direction D2.

The area of the transparent wiring 234 may be greater than that of the second opening 221b. Here, the area of the transparent wiring 234 represents the area of a region of the transparent wiring 234 that corresponds to one pixel, not the area of the entire transparent wiring 234. A boundary between a region in which the transparent wiring 234 is disposed and a region in which the transparent wiring 234 is not disposed may be at the outer portion of the second opening 221b. That is, the boundary may not be on a path of light that passes through the second opening 221b, and thus a user may not easily recognize the transparent wiring 234.

The third insulating layer 218 may be disposed between the transparent wiring 234 and the second opening 221b. That is, the third insulating layer 218 covers the transparent wiring 234, and the second opening 221b may not expose the transparent wiring 234.

As described above, according to an exemplary embodiment, a see-through organic light-emitting display device 2 that improves uniformity by compensating for a voltage drop may be implemented.

Also, the transparent wiring 234 is disposed in the second region 200 of the organic light-emitting display device 2, so that a separate space for disposing lines that do not require a low-resistance line such as the initialization voltage line VLint and/or the reference voltage line VLref is not required, and thus the aperture ratio of the organic light-emitting display device 2 may improve.

While one or more exemplary embodiments have been described with reference to the figures, it will be understood by those of ordinary skill in the art that various changes in form and details may be made therein without departing from the spirit and scope as defined by the following claims.

What is claimed is:

1. An organic light-emitting display device comprising:
a substrate;
a pixel disposed on the substrate and comprising a first region that displays an image and a second region that transmits external light;
a pixel circuit portion disposed in the first region and comprising at least one thin film transistor and at least one capacitor;
a first electrode disposed in the first region and electrically connected with the pixel circuit portion;
a pixel-defining layer comprising a first opening that exposes a portion of the first electrode and a second opening that corresponds to the second region;
a second electrode facing the first electrode;
an organic emission layer disposed between the first electrode and the second electrode; and
a transparent wiring electrically connected with the pixel circuit portion and overlapping the second opening in a plan view, the transparent wiring being a reference voltage line and/or an initialization voltage line,
wherein the transparent wiring is not directly connected to the first electrode, and
wherein the transparent wiring and the second electrode are not overlapped with each other in the second region when viewed in a direction perpendicular to the substrate.

2. The device of claim 1, wherein an area of the transparent wiring is greater than that of the second opening.

3. The device of claim 2, wherein the transparent wiring completely overlaps the second opening.

4. The device of claim 1, wherein the transparent wiring comprises indium tin oxide (ITO).

5. The device of claim 1, wherein a thickness of the transparent wiring is from about 100 Å to about 300 Å.

6. The device of claim 1, wherein the at least one thin film transistor comprises an active layer and a gate electrode insulated from the active layer, and the gate electrode comprises a lower layer comprising a transparent material and an upper layer contacting the lower layer and comprising an opaque conductive material.

7. The device of claim 6, wherein a thickness of the upper layer is greater than that of the lower layer.

8. The device of claim 6, wherein the lower layer and the upper layer comprise a same etching surface.

9. The device of claim 6, wherein the lower layer of the gate electrode and the transparent wiring are disposed in a same layer and comprise a same material.

10. The device of claim 6, wherein the at least one capacitor comprises the gate electrode and an upper electrode facing the gate electrode.

11. The device of claim 10, wherein the pixel comprises a plurality of pixels comprising a first pixel and a second pixel adjacent to each other along a first direction, a scan line or a data line extending along a second direction that crosses the first direction is disposed in a region between the first pixel and the second pixel, and the transparent wiring extends along the first direction such that the transparent wiring is connected to the first pixel and the second pixel.

12. The device of claim 11, wherein each of the first pixel and the second pixel comprises a first sub-pixel, a second sub-pixel, and a third sub-pixel disposed in the first region, and the first sub-pixel, the second sub-pixel, and the third sub-pixel emit red light, green light, and blue light, respectively.

13. The device of claim 11, wherein the scan line is disposed in a layer in which the upper electrode is disposed, comprises a same material as that of the upper electrode, and is electrically connected with the gate electrode.

14. The device of claim 11, wherein the transparent wiring overlaps, in a plan view, the second opening included in each of the first pixel and the second pixel, and at least a portion of the scan line or the data line.

15. The device of claim 1, wherein an insulating structure comprising at least one insulating layer is disposed between the transparent wiring and the second opening.

16. The device of claim 1, further comprising:
a first driving voltage line for selectively applying a first driving voltage to the at least one thin film transistor,
wherein the first driving voltage line, the reference voltage line and the initialization voltage line are electrically connected to the pixel circuit portion.

* * * * *